(12) United States Patent
Ishihara et al.

(10) Patent No.: US 11,348,726 B2
(45) Date of Patent: May 31, 2022

(54) CAPACITOR

(71) Applicant: Murata Manufacturing Co., Ltd., Nagaokakyo (JP)

(72) Inventors: Takehito Ishihara, Nagaokakyo (JP); Noriyuki Inoue, Nagaokakyo (JP); Tatsuya Funaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 219 days.

(21) Appl. No.: 16/527,170

(22) Filed: Jul. 31, 2019

(65) Prior Publication Data
US 2019/0355516 A1   Nov. 21, 2019

Related U.S. Application Data

(63) Continuation of application No. PCT/JP2018/004526, filed on Feb. 9, 2018.

(30) Foreign Application Priority Data

Feb. 14, 2017  (JP) .............................. JP2017-025279

(51) Int. Cl.
  *H01G 4/005*   (2006.01)
  *H01G 4/33*    (2006.01)
  *H01G 9/07*    (2006.01)
  *H01L 49/02*   (2006.01)

(52) U.S. Cl.
  CPC .............. *H01G 4/005* (2013.01); *H01G 4/33* (2013.01); *H01G 9/07* (2013.01); *H01L 28/65* (2013.01); *H01L 28/75* (2013.01)

(58) Field of Classification Search
  CPC ................................. H01G 4/33; H01G 4/012
  See application file for complete search history.

(56) References Cited

U.S. PATENT DOCUMENTS

| 8,084,841 B2 | 12/2011 | Pulugurtha et al. | |
|---|---|---|---|
| 2009/0122460 A1* | 5/2009 | Gschwandtner | H01G 4/008 361/305 |
| 2010/0283122 A1* | 11/2010 | Pulugurtha | B82Y 10/00 257/532 |

(Continued)

FOREIGN PATENT DOCUMENTS

| JP | S61194748 A | 8/1986 |
|---|---|---|
| JP | H02137265 A | 5/1990 |
| JP | 2014241365 A | 12/2014 |

OTHER PUBLICATIONS

International Search Report issued in PCT/JP2018/004526, dated May 1, 2018.

(Continued)

*Primary Examiner* — Eric W Thomas
(74) *Attorney, Agent, or Firm* — ArentFox Schiff LLP

(57) ABSTRACT

A capacitor is provided that includes an electrostatic capacitance forming portion with a first electrode/dielectric layer/second electrode structure, and a silicon portion. Moreover, the silicon portion is disposed on at least a part of a side of the electrostatic capacitance forming portion. When the capacitor is viewed in a thickness direction thereof, a region occupied by the silicon portion in a lower portion of the electrostatic capacitance forming portion is 50% or less.

16 Claims, 13 Drawing Sheets

(56) References Cited

U.S. PATENT DOCUMENTS

2011/0310530 A1* 12/2011 Laor ................ H01G 9/0032
361/524
2015/0028449 A1* 1/2015 Adkisson .......... H01L 21/76224
257/532

OTHER PUBLICATIONS

Written Opinion of the International Searching Authority issued in PCT/JP2018/004526, dated May 1, 2018.

* cited by examiner

CAPACITOR

CROSS REFERENCE TO RELATED APPLICATIONS

The present application is a continuation of PCT/JP2018/004526 filed Feb. 9, 2018, which claims priority to Japanese Patent Application No. 2017-025279, filed Feb. 14, 2017, the entire contents of each of which are incorporated herein by reference.

TECHNICAL FIELD

The present invention relates to a capacitor.

BACKGROUND

In recent years, with high-density mounting of electronic devices, capacitors having higher electrostatic capacitance have been required. As such a capacitor, for example, Patent Document 1 (identified below) discloses a capacitor that forms a capacitor structure including a porous metal sintered body, a dielectric layer, and an upper electrode on a substrate.
Patent Document 1: U.S. Pat. No. 8,084,841.

As disclosed in Patent Document 1, the capacitor that forms a capacitor structure including a porous metal sintered body, a dielectric layer, and an upper electrode on a substrate including silicon, for example, can achieve high electrostatic capacitance. There is, however, a problem that the substrate is present on a first principal surface of the capacitor, so that the capacitor increases in size by the thickness of the substrate. Since miniaturization of electronic components is now required along with the recent high-density mounting of electronic devices, it is not preferable that the thickness of the capacitor increases as described above.

SUMMARY OF THE INVENTION

Accordingly, an object of the present invention is to provide a capacitor that has high electrostatic capacitance and is advantageous for miniaturization.

In view of the above-mentioned problem, a capacitor is provided that includes an electrostatic capacitance forming portion assembled in a silicon base material. The silicon base material is present as least as possible in a lower portion of the electrostatic capacitance forming portion described above, so that a capacitor which is advantageous for miniaturization can be provided.

Therefore, a capacitor is provided according to an exemplary embodiment that includes an electrostatic capacitance forming portion having a first electrode/dielectric layer/second electrode structure, and a silicon portion. Moreover, the silicon portion is present on at least a part of a side of the electrostatic capacitance forming portion, and when the capacitor is viewed in a thickness direction, a region occupied by the silicon portion in a lower portion of the electrostatic capacitance forming portion is 50% or less.

According to the present invention, in the capacitor including an electrostatic capacitance forming portion having a first electrode/dielectric layer/second electrode structure and a silicon portion, a capacitor having a small thickness and a high electrostatic capacitance is provided by disposing the silicon portion on at least a part of a side of the electrostatic capacitance forming portion, and further, setting a region occupied by the silicon portion in a lower portion of the electrostatic capacitance forming portion to 50% or less.

DETAILED DESCRIPTION

The capacitor of the exemplary embodiments of the present invention will be described below in detail with reference to the drawings. The shapes and arrangements of the capacitors and the component elements according to the following embodiments are not limited to those illustrated examples.

Embodiment 1

Figure 1:
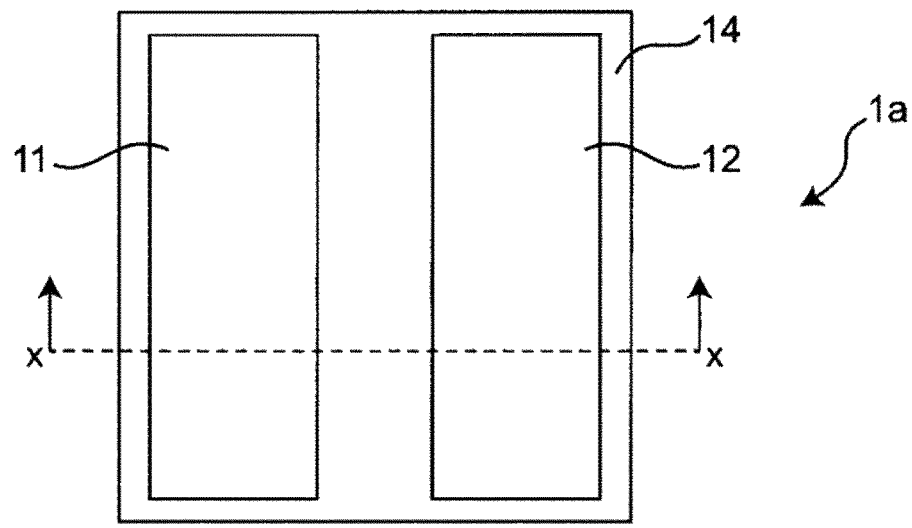
FIG. 1 is a schematic plan view of a capacitor 1a according to an exemplary embodiment of the present invention.
Figure 2:
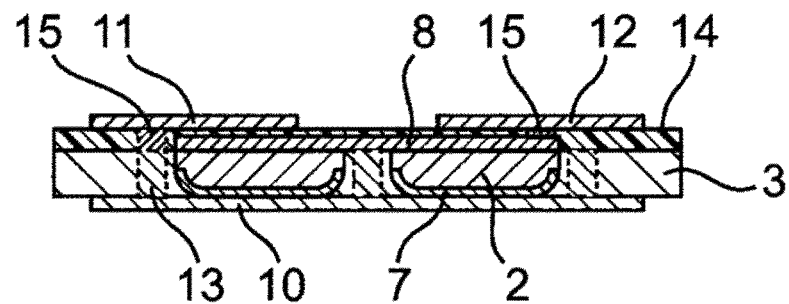
FIG. 2 is a schematic cross-sectional view of the capacitor 1a shown in FIG. 1.
Figure 3:
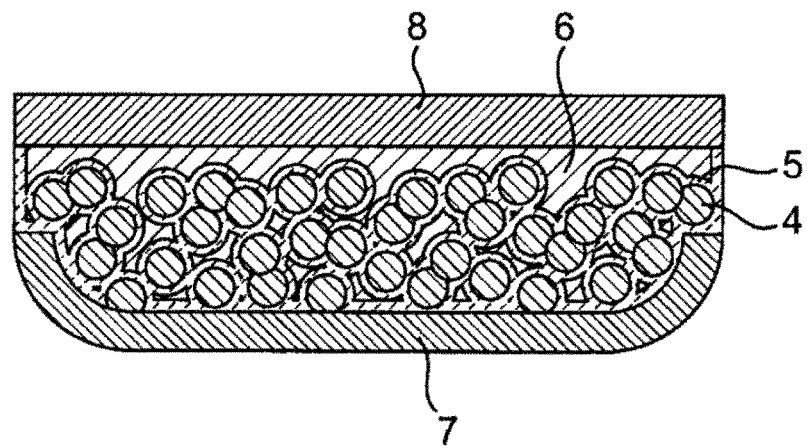
FIG. 3 is a schematic cross-sectional view of an electrostatic capacitance forming portion 2 of the capacitor 1a shown in FIG. 1.

FIG. 1 shows a plan view when viewed from above a capacitor 1a of the present embodiment, FIG. 2 shows a cross-sectional view taken along line x-x, and FIG. 3 shows an enlarged cross-sectional view of an electrostatic capacitance forming portion 2, all figures are in schematic form. In FIG. 2, a through electrode 13 does not appear in the cross section but is present in the back and front of the cross section, and is shown by dotted line for description. As shown in FIGS. 1 to 3, the capacitor 1a of the exemplary embodiment includes four electrostatic capacitance forming portions 2 and a silicon portion 3 is provided around each of the electrostatic capacitance forming portions 2. The electrostatic capacitance forming portion 2 includes a conductive base material having a high specific surface area as a first electrode 4, a dielectric layer 5 located on the first electrode 4, and a second electrode 6 located on the dielectric layer 5. A first extended electrode 7 and a second extended electrode 8 are provided in the lower portion and the upper portion of the electrostatic capacitance forming portion 2, respectively. The first extended electrode 7 is electrically connected to the first electrode 4 of the electrostatic capacitance forming portion 2, and the second extended electrode 8 is electrically connected to the second electrode 6 of the electrostatic capacitance forming portion 2. A bottom electrode 10 is provided on the bottom surface of the capacitor. Further, by rewiring with the bottom electrode 10, upper surface electrodes 11, 12, the through electrode 13, an insulating layer 14, and a via hole 15, the first electrode 4 of the electrostatic capacitance forming portion 2 is electrically connected to the upper surface electrode 11, and the second electrode 6 thereof is electrically connected to the upper surface electrode 12. In the capacitor 1a, a voltage is applied between the upper surface electrodes 11 and 12, so that a voltage is applied between the first electrode 4 and the second electrode 6, which allows electric charge to be accumulated on the dielectric layer 5.

(Manufacturing Method 1)

The capacitor 1a as described above is manufactured in the following manner, for example.

Figure 4A:
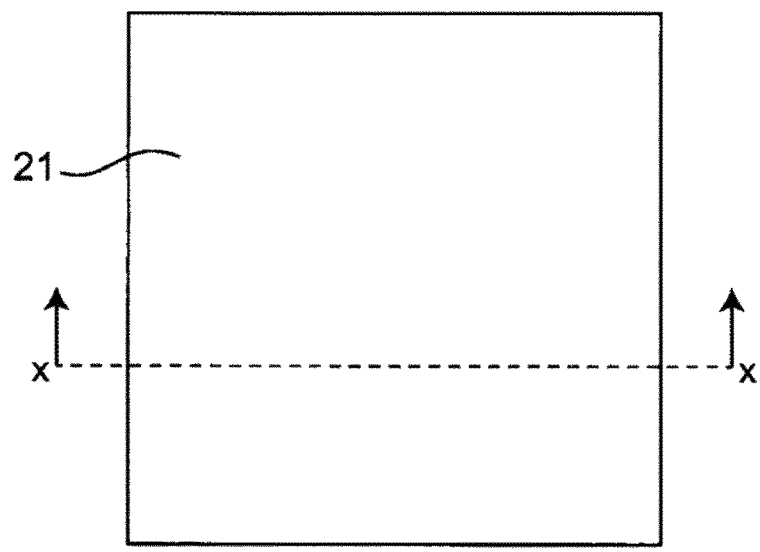
FIG. 4(a) is a schematic plan view for describing a manufacturing method 1 for the capacitor 1a shown in FIGS. 1 to 3.
Figure 4B:
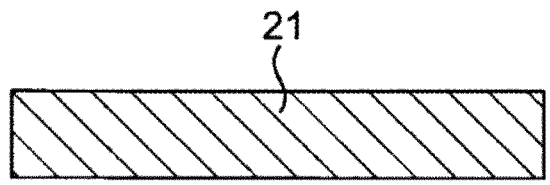
FIG. 4(b) is a schematic cross-sectional view for describing the manufacturing method 1 for the capacitor 1a shown in FIGS. 1 to 3.

First, a silicon wafer 21 is prepared (FIGS. 4(a) and 4(b)). The silicon wafer 21 has a plate-like shape. The thickness of the silicon wafer 21 is appropriately determined depending on the thickness of the electrostatic capacitance forming portion 2 to be manufactured.

Figure 5A:
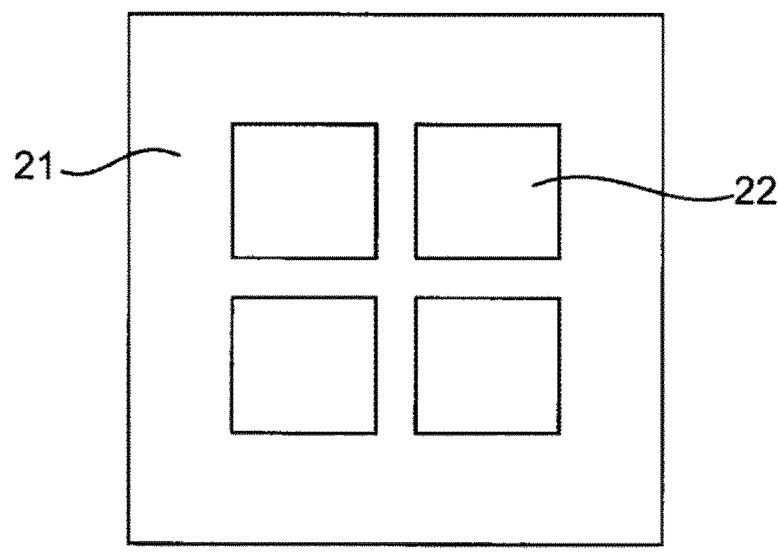
FIG. 5(a) is a schematic plan view for describing the manufacturing method 1 for the capacitor 1a shown in FIGS. 1 to 3.
Figure 5B:
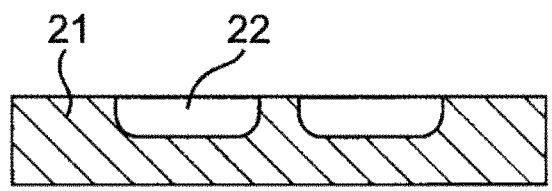
FIG. 5(b) is a schematic cross-sectional view for describing the manufacturing method 1 for the capacitor 1a shown in FIGS. 1 to 3.

Next, a recessed portion 22 is formed on the silicon wafer 21 (FIGS. 5(a) and 5(b)). The size of the recessed portion is appropriately determined depending on the size of the electrostatic capacitance forming portion 2 to be manufactured.

It is noted that the shape of the above-mentioned recessed portion is not particularly limited, and is appropriately determined depending on the size of the electrostatic capacitance forming portion 2 to be manufactured. The recessed portion may have, for example, either a rectangular shape or a trapezoidal shape in cross section. The recessed portion preferably has a generally rectangular parallelepiped as shown in FIG. 3, and preferably has rounded corners at which the wall surface and the bottom surface meet. Such shape allows the silicon wafer to remain at the corners even after the silicon wafer on the bottom surface of the electrostatic capacitance forming portion 2 is removed in the subsequent step, which can prevent the first extended electrode 7 from peeling off.

When the shape is generally rectangular parallelepiped, the above-mentioned recessed portion 22 can have a size of length and width of, for example, 50 μm or more and 2 mm or less, preferably 30 μm or more and 1 mm or less, and more preferably 50 μm or more and 500 μm or less; and a depth of 10 μm or more and 500 μm or less, preferably 20 μm or more and 200 μm or less, and more preferably 20 μm or more and 100 μm or less.

It is noted that he method of forming the recessed portion is not particularly limited and examples thereof include a method using laser, etching, or the like.

Figure 6A:
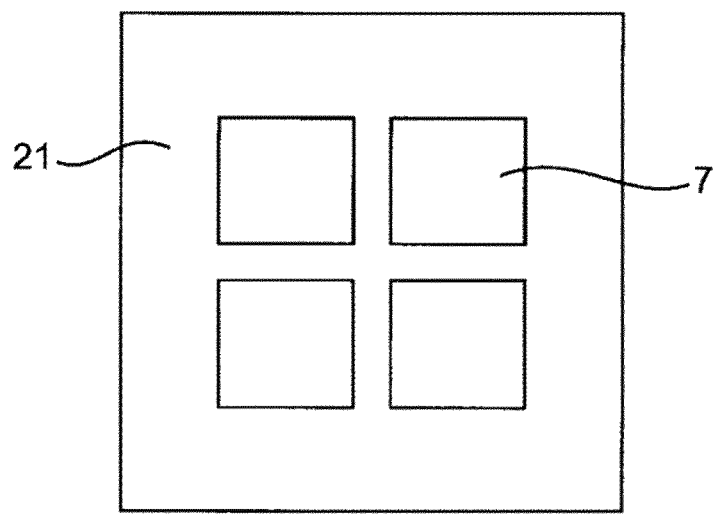
FIG. 6(a) is a schematic plan view for describing the manufacturing method 1 for the capacitor 1a shown in FIGS. 1 to 3.
Figure 6B:
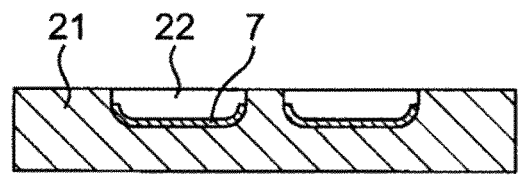
FIG. 6(b) is a schematic cross-sectional view for describing the manufacturing method 1 for the capacitor 1a shown in FIGS. 1 to 3.

Next, the first extended electrode 7 is formed on the bottom surface (including corners) of the recessed portion 22 (FIGS. 6(a) and 6(b)).

The material forming the above-mentioned first extended electrode 7 is not particularly limited, and examples thereof include metals such as Au, Pb, Pd, Ag, Sn, Ni, and Cu, and alloys thereof.

The thickness of the first extended electrode 7 is not particularly limited and is preferably 0.1 μm or more and 100 µm or less, more preferably 0.5 µm or more and 50 µm or less, further preferably 0.5 µm or more and 10 µm or less, and can be, for example, 1 µm or more and 5 µm or less.

The method of forming the first extended electrode 7 is not particularly limited and, for example, chemical vapor deposition (CVD), electrolytic plating, electroless plating, vapor deposition, sputtering, baking of a conductive paste, or other method can be used; electrolytic plating, electroless plating, vapor deposition, or sputtering is preferable; and electrolytic plating is more preferable.

Figure 7A:
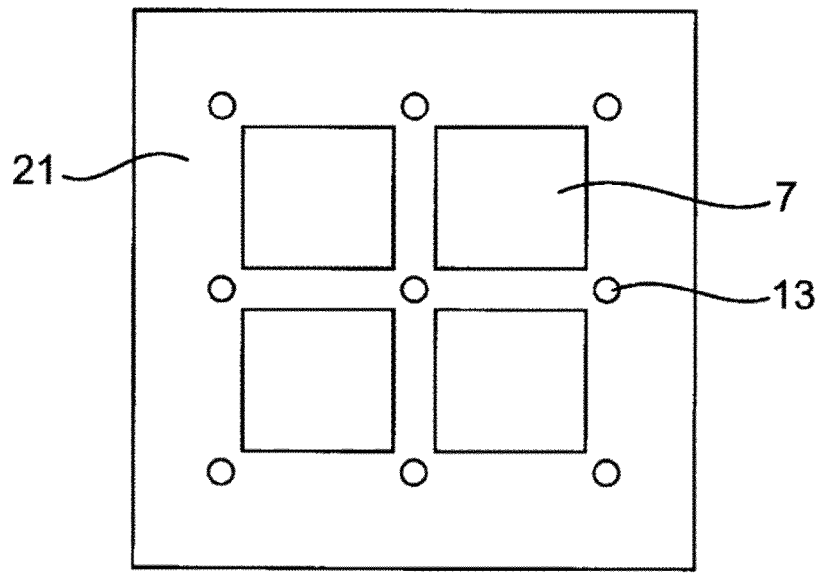
FIG. 7(a) is a schematic plan view for describing the manufacturing method 1 for the capacitor 1a shown in FIGS. 1 to 3.
Figure 7B:
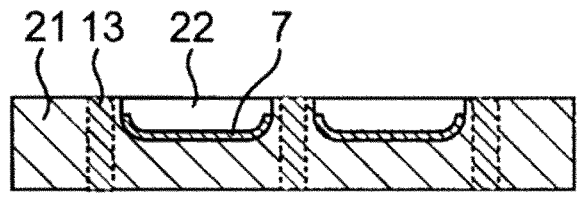
FIG. 7(b) is a schematic cross-sectional view for describing the manufacturing method 1 for the capacitor 1a shown in FIGS. 1 to 3.

Next, the through electrode 13 that passes through the silicon wafer 21 is formed (FIGS. 7(*a*) and 7(*b*)). Specifically, a through hole is formed in the silicon wafer 21, and the through hole thus formed is filled with a conductive material, to thereby form the through electrode 13.

The method of forming the through hole for the above-mentioned through electrode 13 is not particularly limited and examples thereof include a method using laser, etching, or the like.

The conductive material forming the above-mentioned through electrode 13 may be continuously present from the upper surface to the lower surface of the silicon wafer 21 in the through hole. Therefore, the conductive material may be filled so as to form a layer on the wall surface of the through hole or completely filled in the entire through hole. Preferably, the through hole is completely filled with the conductive material. The conductive material inside the through hole, that is, the through electrode 13 allows ensuring conductivity between the upper surface and the lower surface of the silicon wafer 21.

The above-mentioned conductive material is not particularly limited, and examples thereof include metals such as Au, Pb, Pd, Ag, Sn, Ni, and Cu, and alloys thereof.

The method of filling the inside of the above-mentioned through hole with the conductive material includes, for example, CVD, electrolytic plating, electroless plating, vapor deposition, sputtering, and baking of a conductive paste.

Figure 8A:
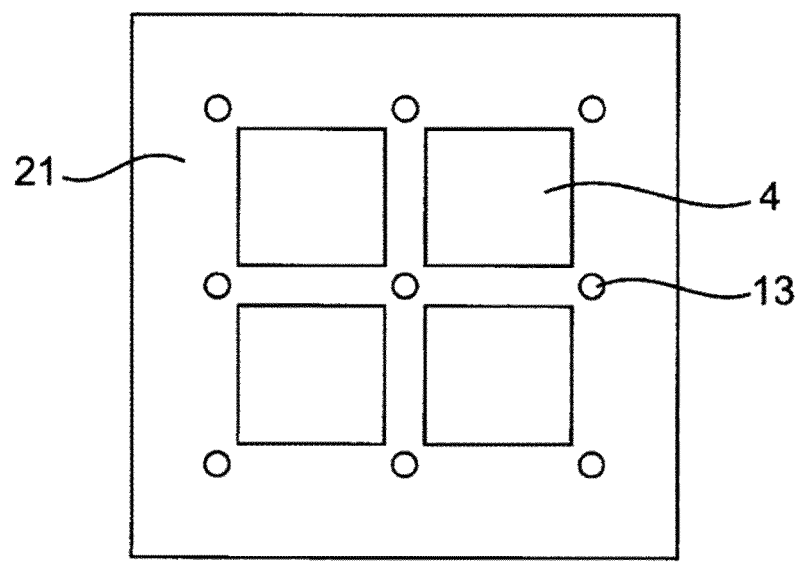
FIG. 8(a) is a schematic plan view for describing the manufacturing method 1 for the capacitor 1a shown in FIGS. 1 to 3.
Figure 8B:
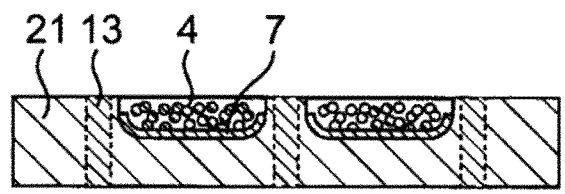
FIG. 8(b) is a schematic cross-sectional view for describing the manufacturing method 1 for the capacitor 1a shown in FIGS. 1 to 3.

Next, a metal sintered body that is a conductive base material having a high specific surface area as the first electrode 4 is formed on the first extended electrode 7 of the recessed portion 22 (FIGS. 8(*a*) and 8(*b*)).

The above-mentioned metal sintered body can be obtained by sintering one or more metal powders. The metal sintered body may be formed by sintering the metal powder in the recessed portion 22 or a metal sintered body separately obtained by sintering the metal powder may be placed in the recessed portion 22. Preferably, the metal sintered body is formed by sintering the metal powder in the recessed portion 22.

Advantageously, a capacitor using the first electrode formed of the metal sintered body as described above obtains a higher electrostatic capacitance density because it has an extremely large surface area.

Here, the term "metal powder" as used herein means an aggregated body of metal particles, showing substantially one peak in the particle size distribution. That is, even a metal powder made of the same constituent element, for example, Ni is regarded as a different metal powder if having a different particle size distribution. In addition, the shape of the metal powder is not particularly limited, and may be a spherical shape, an oval shape, a needle shape, a rod shape, a wire shape, or the like.

In the preferred aspect, the metal sintered body can be obtained by mixing at least two metal powders and then sintering the metal powders thus mixed. As described above, mixing and sintering of two or more metal powders can provide a conductive base material having a high specific surface area with high strength, so that both high electrostatic capacitance density and high strength can be satisfied.

The material forming the metal powder is not particularly limited as long as the material is conductive, and examples thereof include Al, Ti, Ta, Nb, Ni, Cu, W, Mo, Au, Ir, Ag, Rh, Ru, Co, and Fe, or alloys thereof.

Preferably, the metal forming the metal powder is Ni, Cu, W, Mo, Au, Ir, Ag, Rh, Ru, Co, or Fe. Using these materials can reduce the equivalent series resistance (ESR) of the metal sintered body. In addition, these materials have lower resistivities and high melting points, so that annealing is allowed at high temperature and a high-quality dielectric film can be obtained in the following steps.

In one aspect, the mixture of the metal powders includes at least two metal powders having different average particle diameters, for example, two, three, or four metal powders. Using the metal powders having different average particle diameters can improve the strength of the sintered body even though the metal powders are sintered at a lower temperature.

Here, the "average particle diameter" of the metal powder as used herein means an average particle diameter D50 (a particle diameter corresponding to 50% in the volume-based cumulative percentage). Such average particle diameter D50 can be measured with, for example, a dynamic light scattering type particle size analyzer (manufactured by Nikkiso Co., Ltd., UPA).

In addition, the average particle diameter of the metal powders in the metal sintered body can be determined by processing the metal sintered body by focused ion beam (FIB) processing into a thin section, photographing a predetermined region (e.g., 5 µm×5 µm) of this thin section sample using a transmission electron microscope (TEM), and subjecting the obtained image to image analysis.

In another aspect, the mixture of the metal powders includes at least two metal powders having different melting points, for example, two, three, or four metal powders. Using the metal powders having different melting points can improve the strength of the sintered body even though the metal powders are sintered at a lower temperature.

The combination of the metal powder predominantly contained in the metal sintered body and the metal powder having a low melting point is not particularly limited, and examples thereof include a combination of Ni and Cu.

The above-mentioned metal sintered body has a high porosity. From the viewpoint of increasing the specific surface area to further increase the capacitance of the capacitor, the metal sintered body can preferably have a porosity of 30% or more, and more preferably 40% or more. It also preferably has a porosity of 90% or less, and more preferably 80% or less, from the viewpoint of enhancing the mechanical strength.

In this specification, the "porosity" as used herein refers to the proportion of voids in the conductive base material having a high specific surface area. The porosity can be determined as follows. The void in the above-mentioned conductive base material having a high specific surface area can be finally filled with a dielectric layer and a second electrode in the process of preparing the capacitor. The above-mentioned "porosity" is, however, determined by regarding the filled portions as voids without considering the filled substance.

First, the conductive base material having a high specific surface area is processed by focused ion beam (FIB) processing into a thin section. A predetermined region (e.g., 5 µm×5 µm) of this thin section sample is photographed using a transmission electron microscope (TEM). The obtained image is subjected to image analysis, thereby determining the area where a metal of the conductive base material having a high specific surface area is present. Then, the porosity can be calculated by the following equation.

Porosity(%)=((Measured area−Area where metal of base material is present)/Measured area)×100

The thickness of the above-mentioned metal sintered body, that is, the conductive base material having a high specific surface area, is not particularly limited, but can be appropriately selected depending on the purpose, and may be, for example, 5 μm or more, preferably 10 μm or more, further preferably 20 μm or more, preferably 1000 μm or less, more preferably 300 μm or less, and further preferably 50 μm or less. It is to be noted that the thickness of the conductive base material having a high specific surface area means a thickness of the conductive base material having a high specific surface area in the case of assuming that all pores are filled up.

Figure 9A:
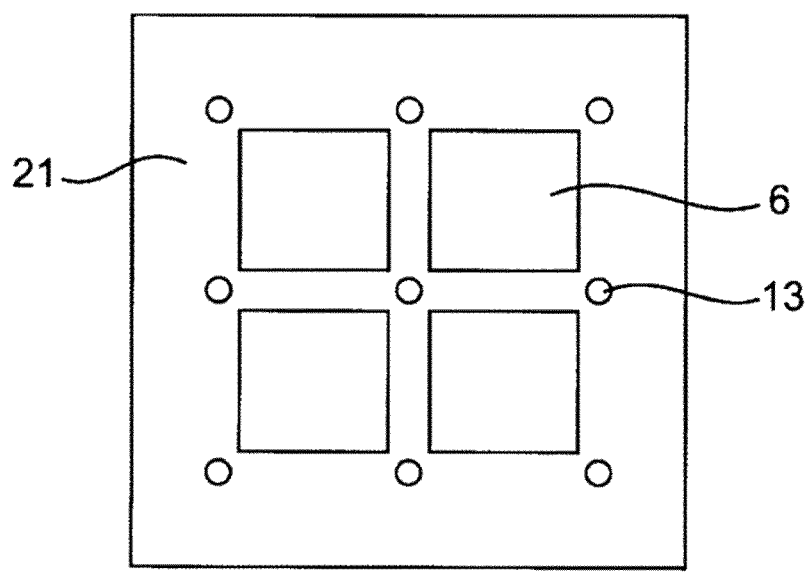
FIG. 9(a) is a schematic plan view for describing the manufacturing method 1 for the capacitor 1a shown in FIGS. 1 to 3.
Figure 9B:
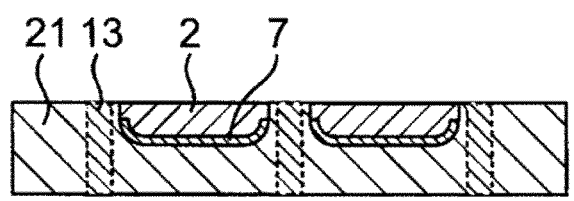
FIG. 9(b) is a schematic cross-sectional view for describing the manufacturing method 1 for the capacitor 1a shown in FIGS. 1 to 3.

Next, the dielectric layer 5 and the second electrode 6 are formed on the metal sintered body as the first electrode 4 of the recessed portion 22 to thereby form the electrostatic capacitance forming portion 2 (FIGS. 9(a) and 9(b)).

It should be appreciated that the material that forms the dielectric layer 5 mentioned above is not particularly limited as long as the material has an insulating property, and examples thereof preferably include metal oxides such as $AlO_x$ (e.g., $Al_2O_3$), $SiO_x$ (e.g., $SiO_2$), $AlTiO_x$, $SiTiO_x$, $HfO_x$, $TaO_x$, $ZrO_x$, $HfSiO_x$, $ZrSiO_x$, $TiZrO_x$, $TiZrWO_x$, $TiO_x$, $SrTiO_x$, $PbTiO_x$, $BaTiO_x$, $BaSrTiO_x$, $BaCaTiO_x$, and $SiAlO_x$; metal nitrides such as $AlN_x$, $SiN_x$, and $AlScN_x$; or metal oxynitrides such as $AlO_xN_y$, $SiO_xN_y$, $HfSiO_xN_y$, and $SiC_xO_yN_z$, and $AlO_x$, $SiO_x$, $SiO_xN_y$, and $HfSiO_x$ are preferable. It is noted that the above-mentioned formulas are merely intended to represent the constitutions of the materials, but not intended to limit the compositions. More specifically, x, y, and z attached to O and N may have any value larger than 0, and the respective elements including the metal elements may have any presence proportion. In addition, the dielectric layer may be a layered compound including a plurality of different layers.

The thickness of the dielectric layer is not particularly limited, and for example, preferably 3 nm or more and 100 nm or less, and more preferably 5 nm or more and 50 nm or less. When the dielectric layer has a thickness of 3 nm or more, the insulating property can be enhanced, which makes it possible to reduce leakage current. In addition, when the dielectric layer has a thickness of 100 nm or less, higher electrostatic capacitance can be obtained.

The dielectric layer is preferably formed by a vapor phase method such as a vacuum deposition method, a CVD method, a sputtering method, an atomic layer deposition (ALD) method, or a pulsed laser deposition (PLD) method, or a method using a supercritical fluid. An ALD method is more preferable because it can form a more homogeneous and dense film even in microscopic regions of pores of the high porosity portion.

The material forming the above-mentioned second electrode 6 is not particularly limited as long as the material is conductive, and examples thereof include Ni, Cu, Al, W, Ti, Ag, Au, Pt, Zn, Sn, Pb, Fe, Cr, Mo, Ru, Pd, and Ta, and alloys thereof, such as CuNi, AuNi, and AuSn, and metal nitrides and metal oxynitrides, such as TiN, TiAlN, TiON, TiAlON, and TaN, and conductive polymers (e.g., PEDOT (poly(3,4-ethylene dioxythiophene)), polypyrrole, polyaniline), and TiN and TiON are preferable.

The thickness of the second electrode is not particularly limited, and for example, preferably 3 nm or more, and more preferably 10 nm or more. When the second electrode has a thickness of 3 nm or more, the resistance of the second electrode itself can be reduced.

The second electrode 6 may be formed by an ALD method. The use of the ALD method can further increase the capacitance of the capacitor. The second electrode may be formed by, as another method, a method such as CVD, plating, bias sputtering, Sol-Gel, or conductive polymer filling, which can coat the second electrode and substantially fill pores of the base material. Preferably, a conductive film is formed on the dielectric layer by the ALD method, and pores may be filled thereon by another approach with a conductive material, preferably a substance having a lower electrical resistance, thereby forming the second electrode. This constitution can efficiently achieve a higher capacitance density and lower equivalent series resistance (ESR).

Figure 10A:
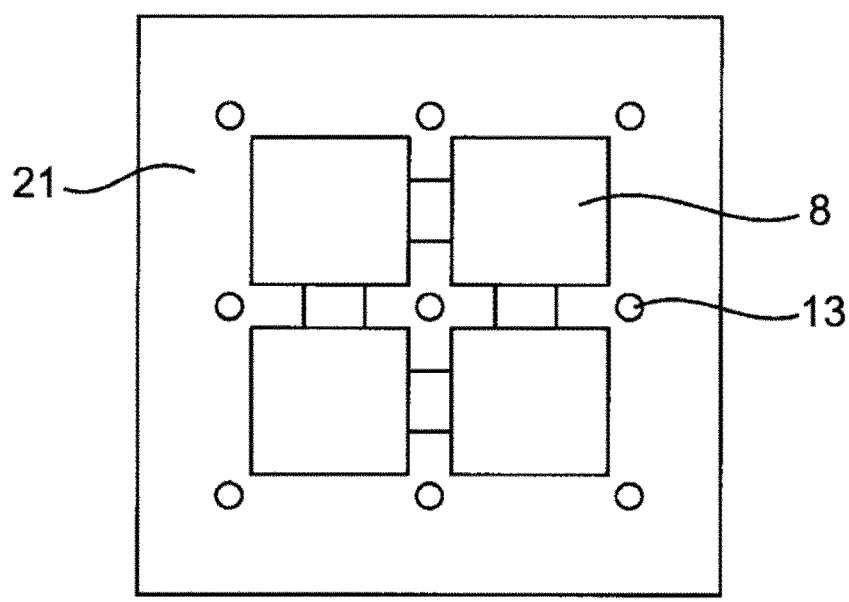
FIG. 10(a) is a schematic plan view for describing the manufacturing method 1 for the capacitor 1a shown in FIGS. 1 to 3.
Figure 10B:
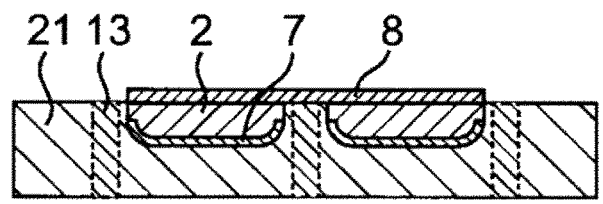
FIG. 10(b) is a schematic cross-sectional view for describing the manufacturing method 1 for the capacitor 1a shown in FIGS. 1 to 3.

Next, the second extended electrode 8 is formed on the second electrode 6 (FIGS. 10(a) and 10(b)).

The material forming the above-mentioned second extended electrode 8 is not particularly limited and examples thereof include metals such as Au, Pb, Pd, Ag, Sn, Ni, and Cu, and alloys thereof, and conductive polymers.

It is noted that the method of forming the second extended electrode 8 is not particularly limited and for example, CVD, electrolytic plating, electroless plating, vapor deposition, sputtering, baking of a conductive paste, or the like can be used, and electrolytic plating, electroless plating, vapor deposition, or sputtering is preferable.

Figure 11A:
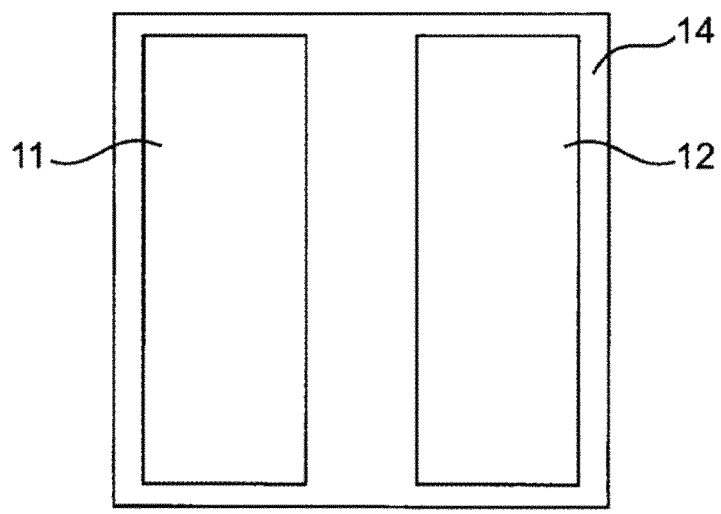
FIG. 11(a) is a schematic plan view for describing the manufacturing method 1 for the capacitor 1a shown in FIGS. 1 to 3.
Figure 11B:
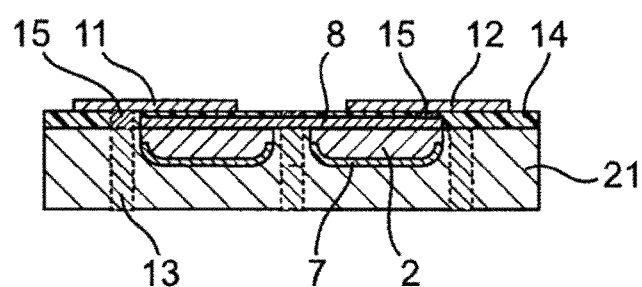
FIG. 11(b) is a schematic cross-sectional view for describing the manufacturing method 1 for the capacitor 1a shown in FIGS. 1 to 3.

Next, a rewiring layer is formed on the upper surface of the capacitor, and upper surface electrodes 11, 12 are further formed thereon (FIGS. 11(a) and 11(b)).

The rewiring layer includes the insulating layer 14 and the via hole 15. Further, in one aspect, the rewiring layer may include wiring. In the rewiring layer, the insulating layer includes via holes (and/or wiring formed on the insulating layer) passing through the insulating layer, and is laminated so that these are electrically connected. The upper surface electrodes 11, 12 are formed on the rewiring layer. The upper surface electrodes 11, 12 are electrically connected to the via holes 15 exposed in the upper portion of the rewiring layer. The rewiring layer has a function of converting an electrode pitch of the capacitor to a pitch suitable for connection to the other electrical element such as a circuit board. In addition, in the case of protruding the electrostatic capacitance forming portion 2 from the recessed portion, the upper surface of the capacitor 1a may become rough, but the rewiring layer covers such roughness, making it possible to flatten the upper surface of the capacitor.

The material forming the above-mentioned insulating layer 14 is not particularly limited as long as the material is an insulating material, and resin or ceramic is used, resin is preferable, and heat resistance resin is more preferable. Specific examples thereof include polyimides, polybenzoxazoles, polyethylene terephthalate, benzocyclobutene resins, and epoxy resins. Further, the insulating layer 14 may include a filler for adjusting a linear expansion coefficient, such as a Si filler.

The thickness of the insulating layer 14 is not particularly limited, and for example, 0.5 μm or more and 1.0 mm or less, preferably 1 μm or more and 200 μm or less, and can be, for example, 10 μm or more and 100 μm or less.

The number of the above-mentioned insulating layer 14 is not particularly limited, and may be, for example, one, or can be two or more and 10 or less, preferably 3 or more and 6 or less.

The material forming the above-mentioned via hole 15 is not particularly limited as long as the material is conductive, and examples thereof include Au, Pb, Pd, Ag, Sn, Ni, and Cu, or alloys thereof. The material forming the via hole 15 is preferably Cu.

The material forming the above-mentioned wiring is not particularly limited as long as the material is conductive, and examples thereof include Au, Pb, Pd, Ag, Sn, Ni, and Cu, or alloys thereof. The material forming the wiring is preferably Cu.

The method of forming the above-mentioned insulating layer 14 is not particularly limited, and the insulating layer 14 can be formed by, for example, applying a coating of resin, and then curing the coat. As the method of applying a coating of resin, spin coating, dispenser coating, spray coating, screen printing, or other method can be used. Alternatively, the insulating layer may be formed by affixing an insulating sheet separately formed.

The method of forming the above-mentioned via hole is not particularly limited, and laser processing, photo via processing or the like can be used, and photo via processing is preferably used.

The method of forming the via hole 15 and wiring described above is not particularly limited and for example, electrolytic plating, electroless plating, CVD, vapor deposition, sputtering, baking of a conductive paste, screen printing, or the like can be used. Electrolytic plating or electroless plating is preferable because an electrical connection between the via hole and the wiring can be further ensured.

The material forming the above-mentioned upper surface electrodes 11, 12 is not particularly limited as long as the material is conductive, and examples thereof include Au, Pb, Pd, Ag, Sn, Ni, and Cu, or alloys thereof. The material forming the upper surface electrodes is preferably Cu.

As another method of forming the above-mentioned rewiring layer, an insulating layer may be separately formed, followed by forming a via hole and wiring thereon, or an insulating sheet including a via hole and wiring may be formed and then affixed.

The method of forming the above-mentioned upper surface electrodes 11, 12 is not particularly limited and for example, electrolytic plating, electroless plating, CVD, vapor deposition, sputtering, baking of a conductive paste, screen printing, or the like can be used. Electrolytic plating or electroless plating is preferable because an electrical connection between the via hole or the wiring of the rewiring layer and the upper surface electrode can be further ensured.

Figure 12A:
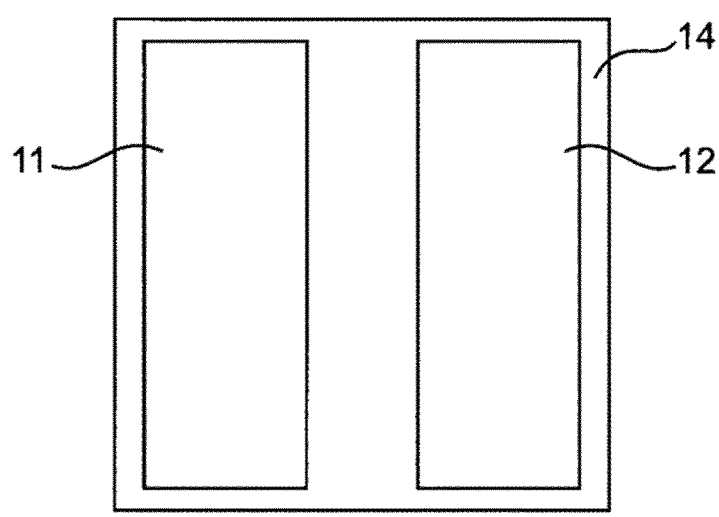
FIG. 12(a) is a schematic plan view for describing the manufacturing method 1 for the capacitor 1a shown in FIGS. 1 to 3.
Figure 12B:
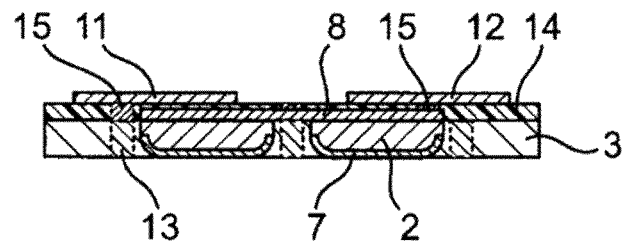
FIG. 12(b) is a schematic cross-sectional view for describing the manufacturing method 1 for the capacitor 1a shown in FIGS. 1 to 3.

Next, the bottom surface of the silicon wafer 21 is removed to expose the first extended electrode 7 (FIGS. 12(a) and 12(b)). After removing, the remaining silicon wafer forms the silicon portion 3 of the capacitor 1a.

The silicon wafer is removed so that a region occupied by the silicon wafer (silicon portion) in the lower portion of the electrostatic capacitance forming portion 2 is 50% or less, preferably 80% or less when the capacitor is projected in the thickness direction. In one aspect, the region occupied by the silicon wafer (silicon portion) in the lower portion of the electrostatic capacitance forming portion is 0%, that is, the silicon portion is not present in the lower portion of the electrostatic capacitance forming portion.

In the present embodiment, the silicon portion is present in the peripheral portion (rounded corners) of the bottom surface of the electrostatic capacitance forming portion 2. Thus, the presence of the silicon portion in the rim of the bottom surface of the electrostatic capacitance forming portion can suppress peeling-off of a layer in the lower portion of the electrostatic capacitance forming portion, for example, the first extended electrode.

The removal of the bottom surface of the silicon wafer 21 results in reduced height of the capacitor 1a thus obtained. That is, such removal is advantageous in miniaturization and higher capacitance.

The method of removing the silicon wafer is not particularly limited and examples thereof include grinding, laser, etching, or the like.

The silicon portion 3 obtained after removal of the silicon wafer 21 can have a width (a distance from a surface in contact with the end of the electrostatic capacitance forming portion 2 to the side surface of the capacitor 1a in the present embodiment) of, for example, 10 µm or more and 1 mm or less, preferably 20 µm or more and 500 µm or less, and more preferably 30 µm or more and 200 µm or less.

Figure 13A:
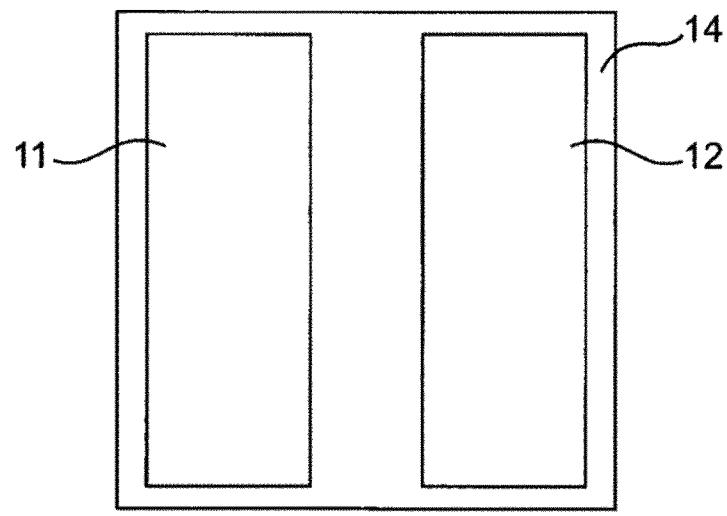
FIG. 13(a) is a schematic plan view for describing the manufacturing method 1 for the capacitor 1a shown in FIGS. 1 to 3.
Figure 13B:
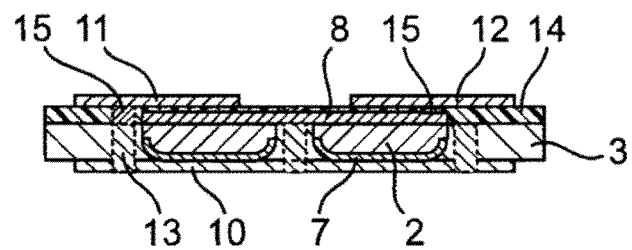
FIG. 13(b) is a schematic cross-sectional view for describing the manufacturing method 1 for the capacitor 1a shown in FIGS. 1 to 3.

Next, the bottom electrode 10 is formed on the bottom surface of the capacitor (FIGS. 13(a) and 13(b)).

The material forming the bottom electrode 10 is not particularly limited as long as the material is conductive, and examples thereof include Au, Pb, Pd, Ag, Sn, Ni, and Cu, or alloys thereof. The material forming the bottom electrode 10 is preferably Cu.

The method of forming the bottom electrode 10 is not particularly limited and for example, electrolytic plating, electroless plating, CVD, vapor deposition, sputtering, baking of a conductive paste, screen printing, or the like can be used. Electrolytic plating or electroless plating is preferable because an electrical connection between the first extended electrode and the through electrode, and the bottom electrode can be further ensured.

As described above, the capacitor 1a of the present embodiment 1 is manufactured.

In the above-mentioned embodiment, the capacitor 1a is manufactured as one capacitor, but may be preferably obtained as an aggregate substrate of a capacitor. The aggregate substrate can be split into capacitors using a dicing blade, various laser devices, a dicer, various cutters, or a mold.

Since the silicon portion is not or minimally present in the lower portion of the electrostatic capacitance forming portion, the capacitor of the present invention is advantageously reduced in height. Further, since the capacitor can be reduced in height, the rewiring layer can be easily placed, which facilitates connection to diverse electrical components, electronic devices or the like.

In addition, since the silicon portion is present on the side of the electrostatic capacitance forming portion, the capacitor has excellent strength. Therefore, as the electrostatic capacitance forming portion, a capacitor structure with less strength and high electrostatic capacitance, for example, a structure using the above-mentioned sintered body, and a structure using a conductive porous base material, can be adopted.

As described above, since the capacitor of the present invention can be manufactured as an aggregate substrate, the size of the entire capacitor and the electrostatic capacitance can be easily adjusted by adjusting the size of the silicon portion that serves as blocks and wall surfaces.

(Manufacturing Method 2)

The capacitor 1a can also be manufactured by another manufacturing method. A manufacturing method 2 for the present embodiment will be described below.

The manufacturing method 2 includes the same steps from preparation of the silicon wafer 21 (FIG. 4) to formation of the first extended electrode 7 (FIG. 6) as the manufacturing method 1 described above.

Figure 14A:
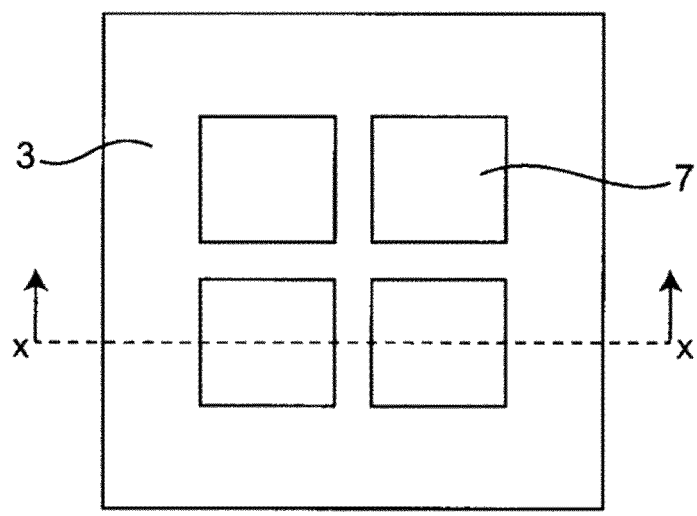
FIG. 14(a) is a schematic plan view for describing the manufacturing method 1 for the capacitor 1a shown in FIGS.
Figure 14B:
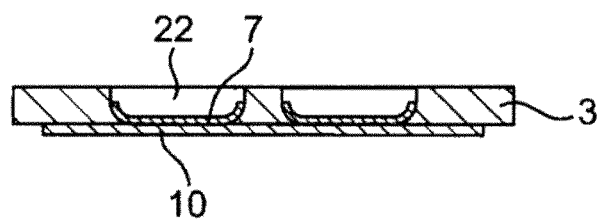
FIG. 14(b) is a schematic cross-sectional view for describing another manufacturing method 1 for the capacitor 1a shown in FIGS. 1 to 3.

In the manufacturing method 2, the first extended electrode 7 is formed, and the bottom surface of the silicon wafer 21 is then removed to expose the first extended electrode 7. This forms a silicon portion 3. Next, a bottom electrode 10 is formed on the bottom surface of the capacitor (FIGS. 14(a) and 14(b)). These steps are conducted in the same manner as the removal of the silicon wafer 21 and the formation of the bottom electrode 10 in the manufacturing method 1 described above.

Figure 15A:
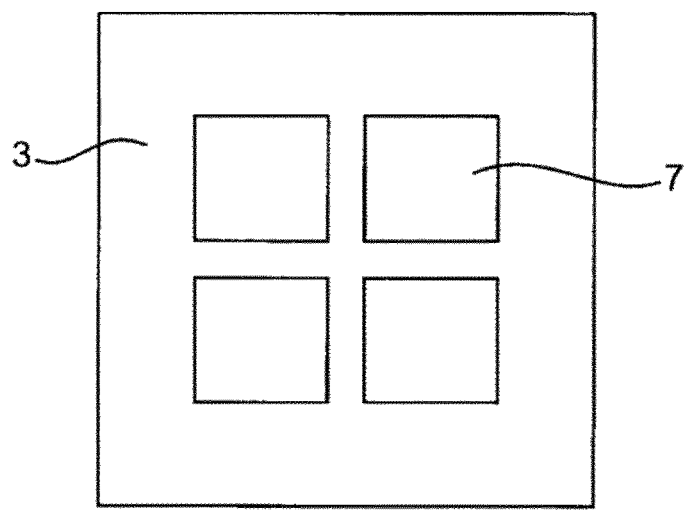
FIG. 15(a) is a schematic plan view for describing a manufacturing method 2 for the capacitor 1a shown in FIGS. 1 to 3.
Figure 15B:
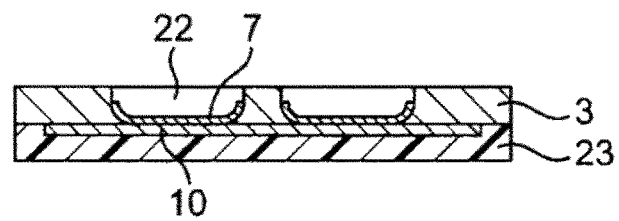
FIG. 15(b) is a schematic cross-sectional view for describing the manufacturing method 2 for the capacitor 1a shown in FIGS. 1 to 3.

Next, a carrier 23 is provided on the bottom surface of the capacitor (FIGS. 15(a) and 15(b)).

The carrier 23 is not particularly limited, and a resin film such as an acrylic resin film, a polyvinyl chloride resin film, or a polyethylene terephthalate (PET) film is preferable.

The carrier 23 may be directly formed on the bottom surface of the capacitor or a separately formed film may be affixed thereto. A resin film separately formed is preferably affixed.

Figure 16A:
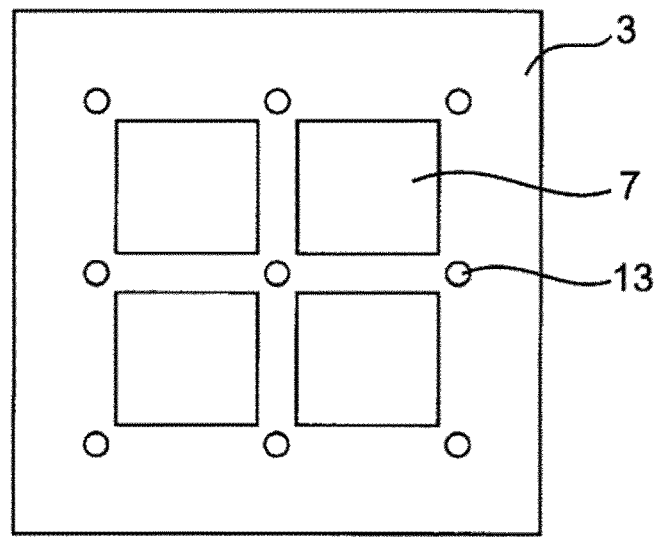
FIG. 16(a) is a schematic plan view for describing the manufacturing method 2 for the capacitor 1a shown in FIGS. 1 to 3.
Figure 16B:
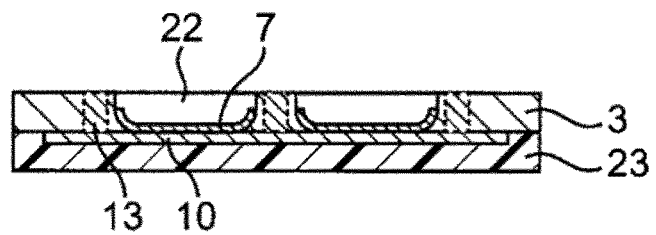
FIG. 16(b) is a schematic cross-sectional view for describing the manufacturing method 2 for the capacitor 1a shown in FIGS. 1 to 3.

Next, a through electrode 13 that passes through the silicon wafer 21 is formed (FIGS. 16(a) and 16(b)). Specifically, a through hole is formed in the silicon wafer 21, and the through hole thus formed is filled with a conductive material, to thereby form the through electrode 13.

The through electrode in the manufacturing method 2 can be formed in the same manner as that in the manufacturing method 1 described above, except that the through hole is formed so as to pass through the silicon wafer 21 but not to pass through the bottom electrode 10 or the carrier 23.

Figure 17A:
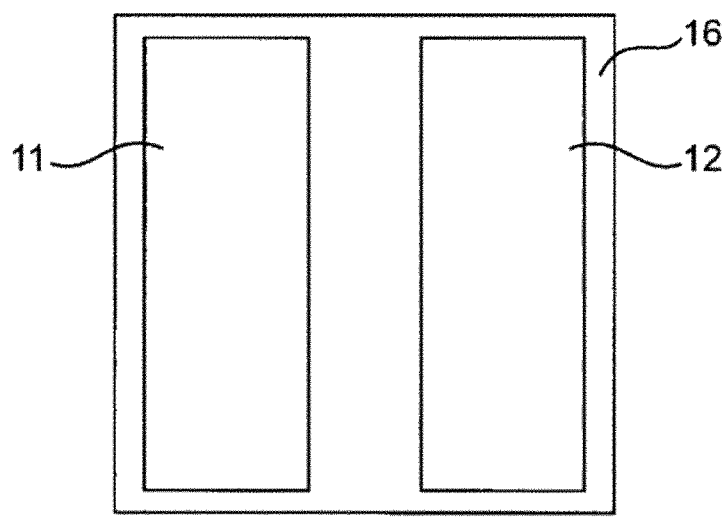
FIG. 17(a) is a schematic plan view for describing the manufacturing method 2 for the capacitor 1a shown in FIGS. 1 to 3.
Figure 17B:
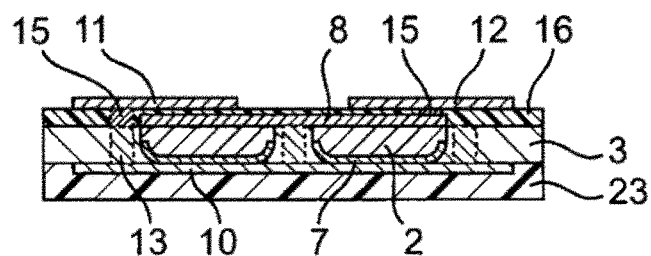
FIG. 17(b) is a schematic cross-sectional view for describing the manufacturing method 2 for the capacitor 1a shown in FIGS. 1 to 3.

Next, a first electrode 4 is formed on the first extended electrode 7 of the recessed portion 22, and a dielectric layer 5 and a second electrode 6 are formed on the first electrode 4, so that an electrostatic capacitance forming portion 2 is formed. Further, a rewiring layer 16 is formed on the upper surface of the capacitor (FIGS. 17(a) and 17(b)). The first electrode 4, the dielectric layer 5, the second electrode 6, and the rewiring layer 16 can be formed in the same manner as those in the manufacturing method 1 described above.

Next, the carrier 23 is removed, so that a capacitor 1a can be manufactured.

In the case of manufacturing the capacitor 1a as an aggregate substrate, the aggregate substrate may be split into capacitors after the carrier 23 is removed, or the carrier 23 may be removed after the aggregate substrate is split into capacitors.

(Manufacturing Method 3)

The capacitor 1a can also be manufactured by still another manufacturing method. A manufacturing method 3 for the present embodiment will be described below.

Figure 18A:
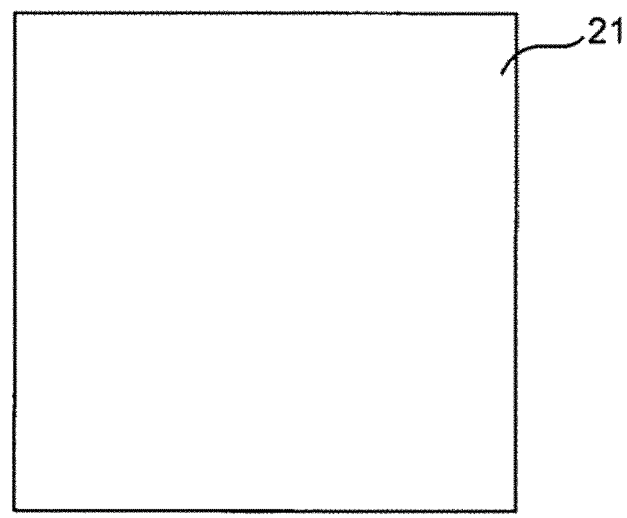
FIG. 18(a) is a schematic plan view for describing a manufacturing method 3 for the capacitor 1a shown in FIGS. 1 to 3.
Figure 18B:
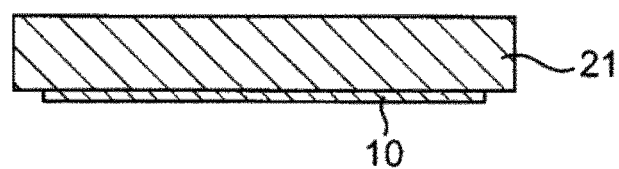
FIG. 18(b) is a schematic cross-sectional view for describing the manufacturing method 3 for the capacitor 1a shown in FIGS. 1 to 3.

First, a silicon wafer 21 is prepared, and a bottom electrode 10 is formed on the silicon wafer 21 (FIGS. 18(a) and 18(b)). The bottom electrode 10 can be formed in the same manner as the bottom electrode in the manufacturing method 1 described above.

Figure 19A:
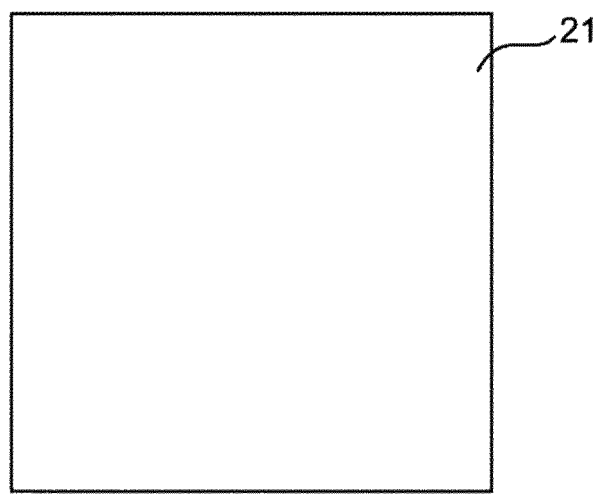
FIG. 19(a) is a schematic plan view for describing the manufacturing method 3 for the capacitor 1a shown in FIGS. 1 to 3.
Figure 19B:
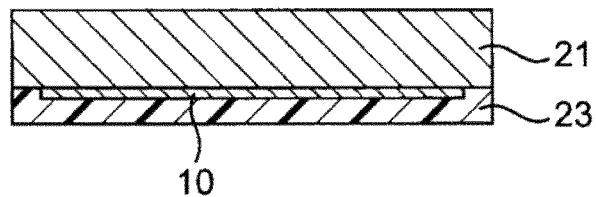
FIG. 19(b) is a schematic cross-sectional view for describing the manufacturing method 3 for the capacitor 1a shown in FIGS. 1 to 3.

Next, a carrier 23 is placed on the bottom surface of the silicon wafer 21 (FIGS. 19(a) and 19(b)). The carrier 23 may be placed in the same manner as the carrier in the above-mentioned manufacturing method 2.

Thereafter, the upper surface of the silicon wafer 21 may be optionally removed to adjust the thickness of the silicon wafer 21. The removal of the silicon wafer 21 can be performed in the same manner as in the manufacturing method 1 described above.

Figure 20A:
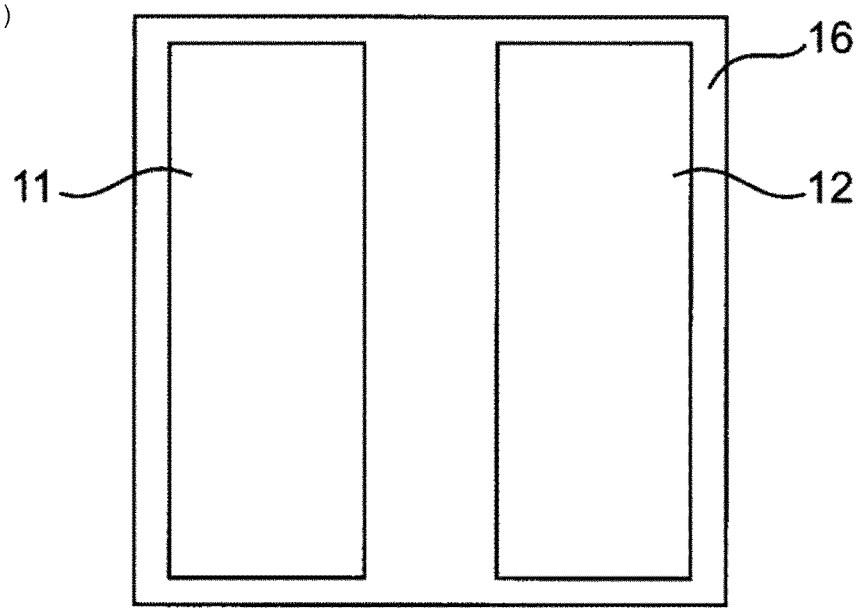
FIG. 20(a) is a schematic plan view for describing a manufacturing method 3 for the capacitor 1a shown in FIGS. 1 to 3.
Figure 20B:
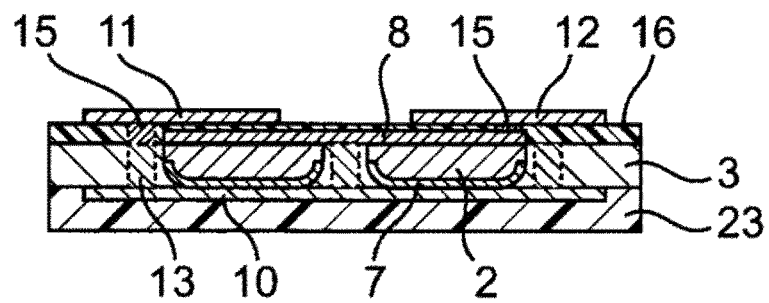
FIG. 20(b) is a schematic cross-sectional view for describing the manufacturing method 3 for the capacitor 1a shown in FIGS. 1 to 3.

Next, a recessed portion 22 is formed on the silicon wafer 21, and a first extended electrode 7 is formed on the bottom surface of the recessed portion 22. Subsequently, a through electrode 13 that passes through the silicon wafer 21 is formed. Then, a first electrode 4 is formed on the first extended electrode 7 of the recessed portion 22, and a dielectric layer 5 and a second electrode 6 are formed on the first electrode 4, so that an electrostatic capacitance forming portion 2 is formed. Further, a rewiring layer 16 is formed on the upper surface of the capacitor (FIGS. 20(a) and 20(b)). These steps can be performed in the same manner as the manufacturing methods 1 and 2 described above.

Next, the carrier 23 is removed, so that a capacitor 1a can be manufactured.

In the same manner as the manufacturing method 2, in the case of manufacturing the capacitor 1a as an aggregate substrate, the aggregate substrate may be split into capacitors after the carrier 23 is removed, or the carrier 23 may be removed after the aggregate substrate is split into capacitors.

Embodiment 2

Figure 21:
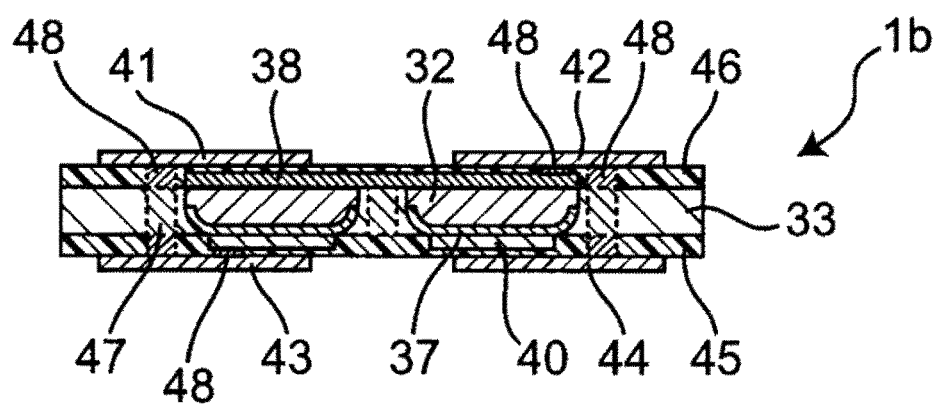
FIG. 21 is a schematic plan view of a capacitor 1b according to another exemplary embodiment of the present invention.

FIG. 21 shows a schematic cross-sectional view of a capacitor 1b according to another embodiment of the present invention.

As shown in FIG. 21, the capacitor 1b of the present embodiment also includes a rewiring layer on the rear surface thereof, as compared with the capacitor 1a. Specifically, the capacitor 1b includes four electrostatic capacitance forming portions 32, and a silicon portion 33 is provided around each of the electrostatic capacitance forming portions 32. A first extended electrode 37 and a second extended electrode 38 are provided in the lower portion and the upper portion of the electrostatic capacitance forming portion 32, respectively. The first extended electrode 37 is electrically connected to a first electrode of the electrostatic capacitance forming portion 32, and the second extended electrode 38 is electrically connected to a second electrode of the electrostatic capacitance forming portion 32. Further, the capacitor 1b includes a first rewiring layer 45 electrically connected to the first extended electrode 37, and a second rewiring layer 46 electrically connected to the second extended electrode 38. By rewiring with the rewiring layers 45, 46, a through electrode 47, and a via hole 48, the first electrode of the electrostatic capacitance forming portion 32 is electrically connected to an upper surface electrode 41 and a lower surface electrode 43, and the second electrode thereof is electrically connected to an upper surface electrode 42 and a lower surface electrode 44.

Thus, the rewiring layer is disposed on both the upper and lower surfaces, which further facilitates connection to the other electrical components, electronic devices or the like.

Embodiment 3

Figure 22:
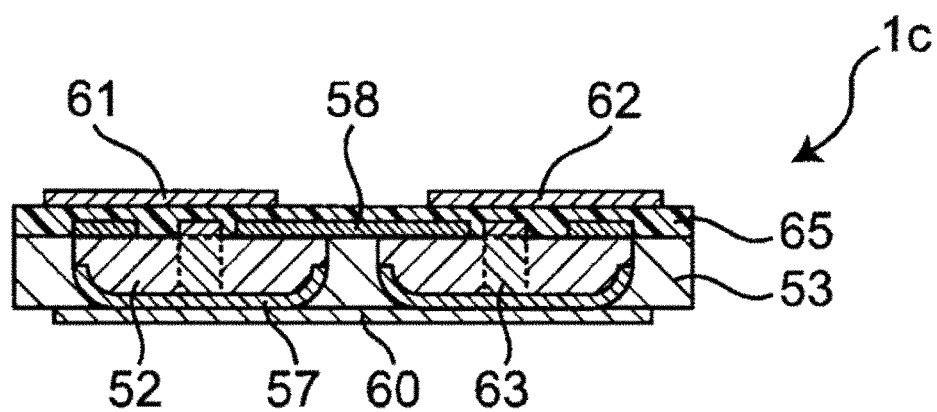
FIG. 22 is a schematic plan view of a capacitor 1c according to another exemplary embodiment of the present invention.

FIG. 22 shows a schematic cross-sectional view of a capacitor 1c according to another embodiment of the present invention.

As shown in FIG. 22, the capacitor 1c of the present embodiment is provided with a through electrode passing through not a silicon portion but an electrostatic capacitance forming portion, as compared with the capacitor 1a. Specifically, the capacitor 1c includes four electrostatic capacitance forming portions 52, and a silicon portion 53 is provided around each of the electrostatic capacitance forming portions 52. A first extended electrode 57 and a second extended electrode 58 are provided in the lower portion and the upper portion of the electrostatic capacitance forming portion 52, respectively. The first extended electrode 57 is electrically connected to a first electrode of the electrostatic capacitance forming portion 52, and the second extended electrode 58 is electrically connected to a second electrode of the electrostatic capacitance forming portion 52. The capacitor 1c includes a rewiring layer 65 electrically connected to the second extended electrode 58 on the upper surface thereof. A bottom electrode 60 is provided on the bottom surface of the capacitor. A through electrode 63 is provided so as to pass through the center portion of the electrostatic capacitance forming portion 52. By rewiring with a bottom electrode 60, a through electrode 63, and a rewiring layers 65, the first electrode of the electrostatic capacitance forming portion 52 is electrically connected to an upper surface electrode 61, and the second electrode thereof is electrically connected to an upper surface electrode 62.

Thus, when the through electrode is provided so as to pass through the electrostatic capacitance forming portion, the strength of the capacitor further increases. Therefore, the thickness of the capacitor can be reduced. In addition, the width of the silicon portion on the side of the capacitor can be reduced.

While the capacitor of the present invention has been described based on the capacitors 1a, 1b, and 1c, it is not intended to limit the capacitor of the present invention to the above-mentioned embodiments and manufacturing methods, but the capacitor of the present invention may be further design-changed within the gist of the invention.

The capacitor of the present invention may include an electrostatic capacitance forming portion having a first electrode/dielectric layer/second electrode structure, and a silicon portion positioned on the side thereof, and the extended electrodes, bottom electrode, through electrode, upper surface electrode, lower surface electrode, rewiring layer, and the like in the capacitors 1a to 1c of the embodiment described above are not essential components and may not be present.

In the capacitors 1a to 1c, the electrostatic capacitance forming portion 2 is surrounded by the silicon portion 3, but the present invention is not limited thereto. For example, the silicon portion may be present on only one side, two sides, or three sides of the electrostatic capacitance forming portion.

Each of the capacitors 1a to 1c includes four electrostatic capacitance forming portions 2, but the present invention is not limited thereto. For example, the capacitor may include only one electrostatic capacitance forming portion, or may include two, three, or five or more. By adjusting the number of electrostatic capacitance forming portions, the electrostatic capacitance can also be easily adjusted. In addition, a plurality of electrostatic capacitance forming portions are formed and each of them is surrounded by the silicon portion, so that the strength of the capacitor can be enhanced.

The capacitor 1a includes an electrostatic capacitance forming portion including a metal sintered body as a first electrode, a dielectric layer located on the first electrode, and a second electrode located on the dielectric layer, but the present invention is not limited thereto.

For example, in one aspect, the electrostatic capacitance forming portion having a first electrode/dielectric layer/second electrode structure can be an electrostatic capacitance forming portion including a conductive base material having a high specific surface area as the first electrode, a dielectric layer located on the conductive base material having a high specific surface area, and a second electrode located on the dielectric layer.

The above-mentioned conductive base material having a high specific surface area includes, in addition to the metal sintered body described above, a conductive porous base material.

The material and the constitution of the conductive porous base material are not limited as long as the conductive porous base material has a porous structure and its surface is conductive. Examples of the conductive porous base material include a porous metal base material, or a base material in which a conductive layer is formed on a surface of a porous silica material, porous carbon material, or a porous ceramic sintered body. In the preferred aspect, the conductive porous base material is a porous metal base material.

Examples of the metal forming the porous metal base material include metals such as aluminum, tantalum, nickel, copper, titanium, niobium, and iron, and alloys such as stainless steel, and Duralumin. The porous metal base material is preferably an aluminum porous base material.

In another aspect, a capacitor separately manufactured may be incorporated in the above-mentioned recessed portion 22.

Such a capacitor is not particularly limited and various capacitors can be used. For example, a laminated capacitor, a winding capacitor, a film capacitor, an electrolytic capacitor, or the like can be used.

DESCRIPTION OF REFERENCE SYMBOLS

1a, 1b, 1c: Capacitor
2: Electrostatic capacitance forming portion
3: Silicon portion
4: First electrode
5: Dielectric layer
6: Second electrode
7: First extended electrode
8: Second extended electrode
10: Bottom electrode
11: Upper surface electrode
12: Upper surface electrode
13: Through electrode
14: Insulating layer
15: Via hole
16: Rewiring layer
21: Silicon wafer
22: Recessed portion
23: Carrier
32: Electrostatic capacitance forming portion
33: Silicon portion
37: First extended electrode
38: Second extended electrode
40: Bottom electrode
41: Upper surface electrode
42: Upper surface electrode
43: Lower surface electrode
44: Lower surface electrode
45: First rewiring layer
46: Second rewiring layer
47: Through electrode
48: Via hole
52: Electrostatic capacitance forming portion
53: Silicon portion
57: First extended electrode
58: Second extended electrode
60: Bottom electrode
61: Upper surface electrode
62: Upper surface electrode 63: Through electrode
65: Rewiring layer

The invention claimed is:

1. A capacitor comprising:
an electrostatic capacitance forming portion having first and second electrodes with a dielectric layer disposed therebetween; and
a silicon portion disposed on at least a part of a side of the electrostatic capacitance forming portion,
wherein, when the capacitor is viewed in a thickness direction thereof, the silicon portion occupies a region that is 50% or less of region of a lower portion of the electrostatic capacitance forming portion,
wherein the first electrode of the electrostatic capacitance forming portion comprises a sintered metal powder with the dielectric layer surrounding thereof,
wherein the capacitor further comprises a first extended electrode disposed on the lower portion of the electrostatic capacitance forming portion and a second extended electrode disposed on an upper portion of the electrostatic capacitance forming portion that is opposite the lower portion, and
wherein the first extended electrode comprises a planar base and rounded corners with the silicon portion surrounding the rounded corners of the first extended electrode.

2. The capacitor according to claim 1, wherein a height of the first extended electrode in the thickness direction of the capacitor corresponds to the lower portion of the electrostatic capacitance forming portion.

3. The capacitor according to claim 1, wherein the silicon portion does not extend into the lower portion of the electrostatic capacitance forming portion.

4. The capacitor according to claim 1, wherein the silicon portion is disposed on sides of the electrostatic capacitance forming portion so as to surround the electrostatic capacitance forming portion.

5. The capacitor according to claim 1, wherein the electrostatic capacitance forming portion includes a conductive base material having a high specific surface area as the first electrode, the dielectric layer is disposed on the conductive base material, and the second electrode is disposed on the dielectric layer.

6. The capacitor according to claim 5, wherein the conductive base material having a high specific surface area is a conductive porous base material.

7. The capacitor according to claim 5, wherein the conductive base material having the high specific surface area is a metal sintered body.

8. The capacitor according to claim 1, further comprising a plurality of the electrostatic capacitance forming portions, wherein each of the electrostatic capacitance forming portions is surrounded by the silicon portion.

9. The capacitor according to claim 1, further comprising a rewiring layer on at least one of an upper surface and a lower surface of the capacitor.

10. A capacitor comprising:
an electrostatic capacitance forming portion having first and second electrodes with a dielectric layer disposed therebetween;
a silicon portion disposed on at least a part of a side of the electrostatic capacitance forming portion; and
a through electrode passing through a center portion of the electrostatic capacitance forming portion and that electrically couples one of the first and second electrodes to an upper surface electrode of the capacitor,
wherein, when the capacitor is viewed in a thickness direction thereof, the silicon portion occupies a region that is 50% or less of region of a lower portion of the electrostatic capacitance forming portion.

11. A capacitor comprising:
an electrostatic capacitance component including:
a first electrode including a sintered metal powder,
a dielectric layer disposed on the first electrode and surrounding the sintered metal powder,
a second electrode disposed on the dielectric layer,
a first extended electrode covering at least a portion of the first electrode to define a lower portion of the electrostatic capacitance forming portion, and
a second extended electrode disposed on an upper portion of the electrostatic capacitance forming portion above the second electrode; and
a silicon layer surrounding at least a portion of the electrostatic capacitance forming portion, such that the silicon layer occupies 50% or less of a region corresponding to the lower portion of the electrostatic capacitance forming portion when the capacitor is viewed in a thickness direction thereof,
wherein the first extended electrode comprises rounded corners with the silicon layer surrounding the rounded corners of the first extended electrode.

12. The capacitor according to claim 11, wherein a height of the first extended electrode in the thickness direction of the capacitor corresponds to the lower portion of the electrostatic capacitance forming portion.

13. The capacitor according to claim 11, wherein the silicon layer does not extend into the lower portion of the electrostatic capacitance forming portion.

14. The capacitor according to claim 11, wherein the electrostatic capacitance forming portion includes a conductive base material having a high specific surface area as the first electrode, the dielectric layer is disposed on the conductive base material, and the second electrode is disposed on the dielectric layer.

15. The capacitor according to claim 14, wherein the conductive base material having a high specific surface area is a conductive porous base material.

16. The capacitor according to claim 14, wherein the conductive base material having the high specific surface area is a metal sintered body.

\* \* \* \* \*